(12) United States Patent
Sugawara et al.

(10) Patent No.: US 11,114,604 B2
(45) Date of Patent: Sep. 7, 2021

(54) METHOD OF MANUFACTURING MEMS DEVICE AND MEMS DEVICE

(71) Applicant: SEIKO EPSON CORPORATION, Tokyo (JP)

(72) Inventors: Yoshiki Sugawara, Shiojiri (JP); Takeshi Yasoshima, Matsumoto (JP); Miyuki Muramoto, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 402 days.

(21) Appl. No.: 16/044,734

(22) Filed: Jul. 25, 2018

(65) Prior Publication Data

US 2019/0036006 A1    Jan. 31, 2019

(30) Foreign Application Priority Data

Jul. 27, 2017 (JP) .............................. JP2017-145194

(51) Int. Cl.
*B41J 2/14* (2006.01)
*H01L 41/25* (2013.01)
(Continued)

(52) U.S. Cl.
CPC .......... *H01L 41/25* (2013.01); *B41J 2/14233* (2013.01); *B41J 2/161* (2013.01); *B41J 2/1623* (2013.01); *B41J 2/1629* (2013.01); *B41J 2/1635* (2013.01); *B41J 2/1646* (2013.01); *B81C 1/00095* (2013.01); *B81C 1/00134* (2013.01); *H01L 41/0475* (2013.01); *H01L 41/0815* (2013.01); *H01L 41/0973* (2013.01); *H01L 41/29* (2013.01); *H01L 41/319* (2013.01); *B41J 2002/14241* (2013.01);
(Continued)

(58) Field of Classification Search
CPC B41J 2/14201; B41J 2/16233; B41J 2/16274; B41J 2/16209; B41J 2/1433
See application file for complete search history.

(56) References Cited

U.S. PATENT DOCUMENTS 9,254,657 B1 *   2/2016  Takada et al. ......... B41J 2/1433
2005/0262691 A1  12/2005 Torimoto et al.
2016/0035966 A1   2/2016 Hamaguchi et al.

FOREIGN PATENT DOCUMENTS

JP      2006-044083 A  *  2/2006
JP       2006044083 A     2/2006
(Continued)

OTHER PUBLICATIONS

Partial European Search Report issued in Application No. 18185609 dated Dec. 7, 2018.

(Continued)

*Primary Examiner* — Erica S Lin
(74) *Attorney, Agent, or Firm* — Workman Nydegger

(57) ABSTRACT

Provided is a method of manufacturing a MEMS device including forming, in a metal layer, an opening that enables a first space and a second space to communicate with each other by exposing the metal layer to an etching solution in a state where the metal layer is left at a boundary between the first space and the second space, and covering an inner surface of an opening of each of an adhesive layer and the metal layer by forming a protective layer from an inner surface of the first space to an inner surface of the second space after the opening of the metal layer is formed.

9 Claims, 9 Drawing Sheets

(51) Int. Cl.
*H01L 41/047* (2006.01)
*H01L 41/09* (2006.01)
*B41J 2/16* (2006.01)
*H01L 41/319* (2013.01)
*B81C 1/00* (2006.01)
*H01L 41/08* (2006.01)
*H01L 41/29* (2013.01)

(52) U.S. Cl.
CPC .......... *B41J 2002/14419* (2013.01); *B41J 2002/14491* (2013.01); *B81B 2201/03* (2013.01)

(56) References Cited

FOREIGN PATENT DOCUMENTS

| | | | |
|---|---|---|---|
| JP | 2006-082529 | A | 3/2006 |
| JP | 2008062451 | A | 3/2008 |
| JP | 2008073961 | A | 4/2008 |
| JP | 2009-018449 | A | 1/2009 |
| JP | 2012-011558 | A | 1/2012 |
| JP | 2013-223998 | A | 10/2013 |
| JP | 2014-124887 | A | 7/2014 |
| JP | 2016-032055 | A | 3/2016 |

OTHER PUBLICATIONS

Extended European Search Report issued in Application No. 18185609 dated Apr. 1, 2019.

* cited by examiner

METHOD OF MANUFACTURING MEMS DEVICE AND MEMS DEVICE

CROSS REFERENCES TO RELATED APPLICATIONS

This application claims priority to Japanese Patent Application No. 2017-145194 filed on Jul. 27, 2017. The entire disclosure of Japanese Patent Application No. 2017-145194 is hereby incorporated herein by reference.

BACKGROUND

1. Technical Field

The present invention relates to a method for manufacturing a MEMS device having two members joined via an adhesive layer, and a MEMS device.

2. Related Art

A micro electro mechanical systems (MEMS) device is a device in which actuators, sensors and the like are integrated by micro-fabrication technology and has been applied to various devices. For example, a liquid ejecting apparatus includes a liquid ejecting head, which is a type of MEMS device, and ejects (discharges) various liquids from the liquid ejecting head. As liquid ejecting apparatuses, there exist image recording devices such as ink jet printers, ink jet plotters and the like; however, recently, liquid ejecting heads have been applied to various manufacturing devices by utilizing their advantage of being capable of making a minute amount of liquid land accurately onto a designated position. For example, liquid ejecting apparatuses have been applied to display manufacturing devices that manufacture color filters of liquid crystal displays and the like, electrode forming devices that form electrodes of organic electroluminescence (EL) displays, field emission displays (FEDs) and the like, and chip manufacturing devices that manufacture biochemical elements (biochips). In addition, a recording head for image recording devices ejects liquid ink, and a color material ejection head for display manufacturing devices ejects solutions of individual color materials of red (R), green (G), and blue (B). In addition, an electrode material ejecting head for electrode forming devices ejects a liquid electrode material and a bioorganic matter ejecting head for chip manufacturing devices ejects a solution of bioorganic matter.

The liquid ejecting head is provided with a plurality of pressure chambers communicating with nozzles and a reservoir for supplying liquid to each of the pressure chambers. As such a reservoir, as exemplified in JP-A-2013-223998, there is a reservoir formed across two substrates. A liquid protective film is formed on the inner surface of a flow path that includes a portion of the reservoir formed in one of the two substrates. Such a liquid protective film, in a state where a metal layer is left at the boundary between one substrate and the other substrate in the reservoir, is formed by forming an ink-resistant film in the flow path on one substrate by sputtering or the like.

In JP-A-2013-223998, the protective film is not formed on exposed portions in the reservoir such as an inner surface of a flow path formed on the other substrate, an adhesive for adhering one substrate to the other substrate, and the like. Consequently, the adhesive may be exposed to liquid in the reservoir, and, depending on the type of liquid stored in the reservoir, it is possible that the adhesive force of the adhesive may become weakened. As a result, there is a possibility that the liquid may enter an inner space (for example, a space where a piezoelectric element is arranged) or the like from the interface of the adhesive. Further, although it is conceivable to form the protective film again on the exposed portion of the other substrate and the exposed portion of the adhesive after forming the protective film on one substrate, there is a problem that the number of operations increases and manufacturing cost increases. In addition, such a problem is not limited to the reservoir of the liquid ejecting head, but also occurs in a MEMS device having a space formed across two substrates. That is, even in a MEMS device in which a liquid does not flow in a space, the adhesive may be exposed to moisture, sulfur components, or the like in the air, and the adhesive force of the adhesive may be weakened.

SUMMARY

An advantage of some aspects of the invention is that a method of manufacturing a MEMS device in which a protective layer for protecting an adhesive layer is formed and a MEMS device are provided.

A method of manufacturing a MEMS device according to a first aspect of the invention in which a first member, in which a metal layer and a first space are formed, and a second member, in which a second space that communicates with the first space is formed, are joined via an adhesive layer which encloses at least a communication portion between the first space and the second space, includes forming, in the metal layer, an opening that enables the first space and the second space to communicate with each other by exposing the metal layer to an etching solution in a state where the metal layer is left at a boundary between the first space and the second space, and covering the inner surface of the opening of each of the adhesive layer and the metal layer by forming a protective layer from the inner surface of the first space to the inner surface of the second space after the opening of the metal layer is formed.

According to the above manufacturing method, the adhesive layer and an adhesive layer interface (in particular, the interface of the adhesive layer and the metal layer) can be protected by the protective layer. Consequently, even if a liquid or the like that affects the adhesive layer is present in the first space and the second space, weakening of the adhesive force of the adhesive layer by the liquid or the like can be suppressed. As a result, it is possible to suppress problems such as the entry of liquid or the like from the interface of the adhesive layer. In addition, because the protective layer is formed from the inner surface of the first space to the inner surface of the second space in the covering of the adhesive layer and the inner surface of the opening of the metal layer, it is possible to reduce the number of operations compared with a manufacturing method in which, after a protective layer is formed on either one of the first member and the second member, a protective layer is formed on the other member.

In the forming of the opening in the metal layer of the above manufacturing method, it is preferable that the opening be formed leaving at least a portion of the metal layer in a region overlapping with the adhesive layer.

Accordingly, because the metal layer remains in the region overlapping with the adhesive layer, the adhesive strength can be increased as compared with the case where no metal layer is left. That is, if the metal layer does not remain, gaps are formed in the portion where the metal layer was present, and there is a possibility that the adhesive strength may be lowered. However, such a reduction in strength can be suppressed by leaving the metal layer in the region overlapping with the adhesive layer. In addition, by leaving the metal layer in the region overlapping with the adhesive layer, it is possible to reduce the region where the adhesive layer is likely to be exposed.

In addition, in the covering of the inner surface of the opening of each of the adhesive layer and the metal layer in the above manufacturing method, it is preferable to form the protective layer by an atomic layer deposition method.

Accordingly, even if irregularities are present from the inner surface of the first space to the inner surface of the second space, the protective layer can be easily formed uniformly.

Furthermore, in the above manufacturing method, it is preferable that the second space be formed so as to pass through the second member, and in the covering of the inner surface of the opening of each of the adhesive layer and the metal layer, it is preferable to form the protective layer in a state of closing an opening of the second space on the opposite side to the first space.

Accordingly, it is possible to suppress the deposition of the protective layer on components (for example, circuit wiring and the like) outside the second space of the second member when the protective layer is formed. In addition, in the case where the protective layer is formed by placing the second-member-side surface on a stage, it is also possible to suppress deposition of the protective layer on the stage.

In addition, in the above manufacturing method, it is preferable that a contact layer be formed between the metal layer and the first member.

Accordingly, the adhesion of the metal layer to the first member can be improved. In addition, the reliability of the MEMS device can be improved by forming the contact layer out of a layer that is hard to corrode such as nickel chromium.

In addition, in the above manufacturing method, it is preferable that the contact layer be formed of Ni, Cr, Ti, TiW, or NiCr. By using any of these materials for the contact layer, the reliability of the MEMS device can be improved.

In addition, in the above manufacturing method, it is preferable that a pressure chamber be formed in the first member, a housing space be formed in the second member, a piezoelectric element be housed in the housing space, and a vibration plate be provided between the pressure chamber and the piezoelectric element.

In addition, in the above manufacturing method, it is preferable that Au be used for the metal layer.

In addition, in the above manufacturing method, it is preferable that a layer of NiCr be formed between the metal layer and the first member. By forming a layer of NiCr that is hard to corrode, the reliability of the MEMS device can be improved.

In addition, in the above manufacturing method, it is preferable that TaOx be used for the protective layer. By using TaOx, which is resistant to solvents, for the protective layer, the reliability of the MEMS device can be improved.

In addition, it is preferable that the above manufacturing method further include joining a nozzle plate having a nozzle formed thereon to the first member so that the communication portion and the nozzle communicate with each other through the pressure chamber.

A MEMS device according to a second aspect of the invention is a MEMS device in which a first member, on which a metal layer is stacked and in which a first space is formed, and a second member, in which a second space communicating with the first space is formed, are joined via an adhesive layer, includes a first opening formed in a communication portion of the first space that enables communication with the second space, a second opening formed in a communication portion of the second space that enables communication with the first space, a third opening formed in the metal layer in a communication portion between the first space and the second space to enable the first space and the second space to communicate with each other, a fourth opening formed in the adhesive layer in a communication portion between the first space and the second space to enable the first space and the second space to communicate with each other, and a protective layer covering an inner surface of each of the first opening, the second opening, the third opening, and the fourth opening. The opening width of the third opening in one direction is wider than the opening width of the first opening in the one direction and the opening width of the second opening in the one direction, and the opening width of the fourth opening in one direction is narrower than the opening width of the first opening in the one direction and the opening width of the second opening in the one direction.

According to this configuration, the adhesive layer and an interface of the adhesive layer can be protected by the protective layer. In addition, because the third opening is formed so as to be wide, the interface between the metal layer and the adhesive layer can be retracted away from the communication portion between the first space and the second space. Consequently, it is possible to prevent liquid or the like from entering the interface of the metal layer and the adhesive layer and to suppress a decrease in the adhesive strength of the adhesive layer. In addition, because the fourth opening is formed so as to be narrow, the amount of the adhesive forming the adhesive layer can be increased. Consequently, it is possible to increase the adhesive strength. In addition, by narrowing the fourth opening, it is possible to reduce the cross-sectional area of the communication portion between the first space and the second space. Consequently, it is possible to increase the flow velocity of the communication portion, and for example, when a liquid flows, it is easy to discharge dust, air bubbles or the like.

In addition, in the above configuration, it is preferable that a contact layer be formed between the metal layer and the first member.

Accordingly, the adhesion of the metal layer to the first member can be improved. In addition, the reliability of the MEMS device can be improved by forming the contact layer out of a layer that is hard to corrode such as nickel chromium.

In addition, in the above configuration, it is preferable that the contact layer be formed of Ni, Cr, Ti, TiW, or NiCr. By using any of these materials for the contact layer, the reliability of the MEMS device can be improved.

In addition, in the above configuration, it is preferable that a pressure chamber be formed in the first member, a housing space be formed in the second member, a piezoelectric element be housed in the housing space, and a vibration plate be provided between the pressure chamber and the piezoelectric element.

In addition, in the above configuration, it is preferable that Au be used for the metal layer.

In addition, in the above configuration, it is preferable that a layer of NiCr be formed between the metal layer and the first member. By forming a layer of NiCr that is hard to corrode, the reliability of the MEMS device can be improved.

In addition, in the above configuration, it is preferable that TaOx be used for the protective layer. By using TaOx, which is resistant to solvents, for the protective layer, the reliability of the MEMS device can be improved.

In addition, in the above configuration, it is preferable that a nozzle plate having a nozzle formed thereon be joined to the first member so that the communication portions and the nozzle communicate with each other through the pressure chamber.

In addition, in the above configuration, it is preferable that a liquid flow between the nozzle and the communication portions.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, modes for carrying out the invention will be described with reference to the accompanying drawings. Further, the embodiment described below is a preferred embodiment of the invention, and even though various limitations are imposed, the scope of the invention is not intended to be limited to these limitations unless there is a particular description that limits the invention in the following description. In addition, hereinafter, an ink jet printer (hereinafter referred to as a printer 1) which is a type of liquid ejecting apparatus including an ink jet recording head (hereinafter referred to as a recording head 3) which is one type of MEMS device of the invention will be described.

Figure 1:
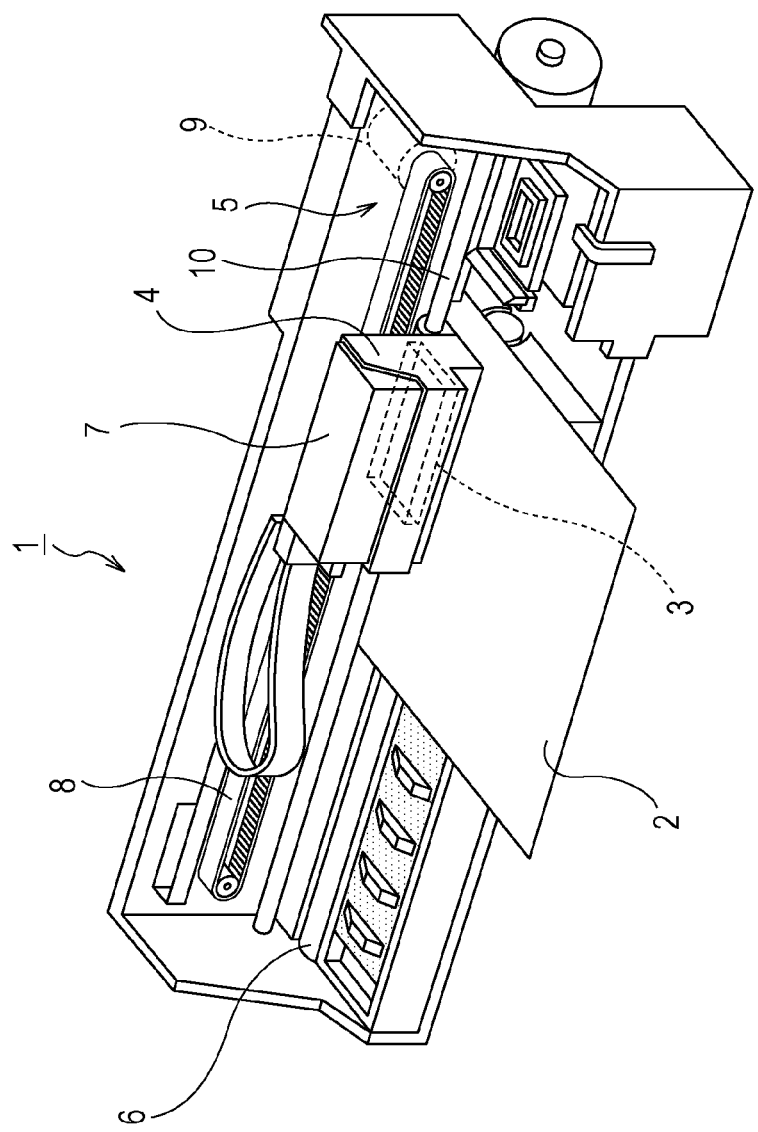
FIG. 1 is a perspective diagram illustrating a configuration of a printer.

FIG. 1 is a perspective view for explaining a configuration of a printer. The printer 1 is an apparatus that performs recording of an image or the like by ejecting liquid ink onto the surface of a recording medium 2 (a type of landing target) such as recording paper. The printer 1 includes the recording head 3, a carriage 4 on which the recording head 3 is mounted, a carriage moving mechanism 5 that moves the carriage 4 in a main scanning direction, a transport mechanism 6 that transports the recording medium 2 in a sub-scanning direction, and the like. Here, the ink in this embodiment is a solvent type ink (a type of liquid of the invention), and is stored in an ink cartridge 7 as a liquid supply source. The ink cartridge 7 is detachably attached to the recording head 3. Further, the ink cartridge may have a configuration that the ink cartridge is arranged in the body of the printer and that enables the recording head to be supplied with ink from the ink cartridge by an ink supply tube.

The carriage moving mechanism 5 has a timing belt 8. The timing belt 8 is driven by a pulse motor 9 such as a DC motor. Therefore, when the pulse motor 9 operates, the carriage 4 is guided by a guide rod 10 that is installed in the printer 1 and the carriage 4 reciprocates in the main scanning direction (the width direction of the recording medium 2). Then, the printer 1 causes the recording head 3 to be relatively moved in the main scanning direction by the carriage moving mechanism 5 while sequentially transporting the recording medium 2 in the sub-scanning direction intersecting the main scanning direction by the transport mechanism 6, so that an image or the like is recorded on the recording medium 2.

Figure 2:
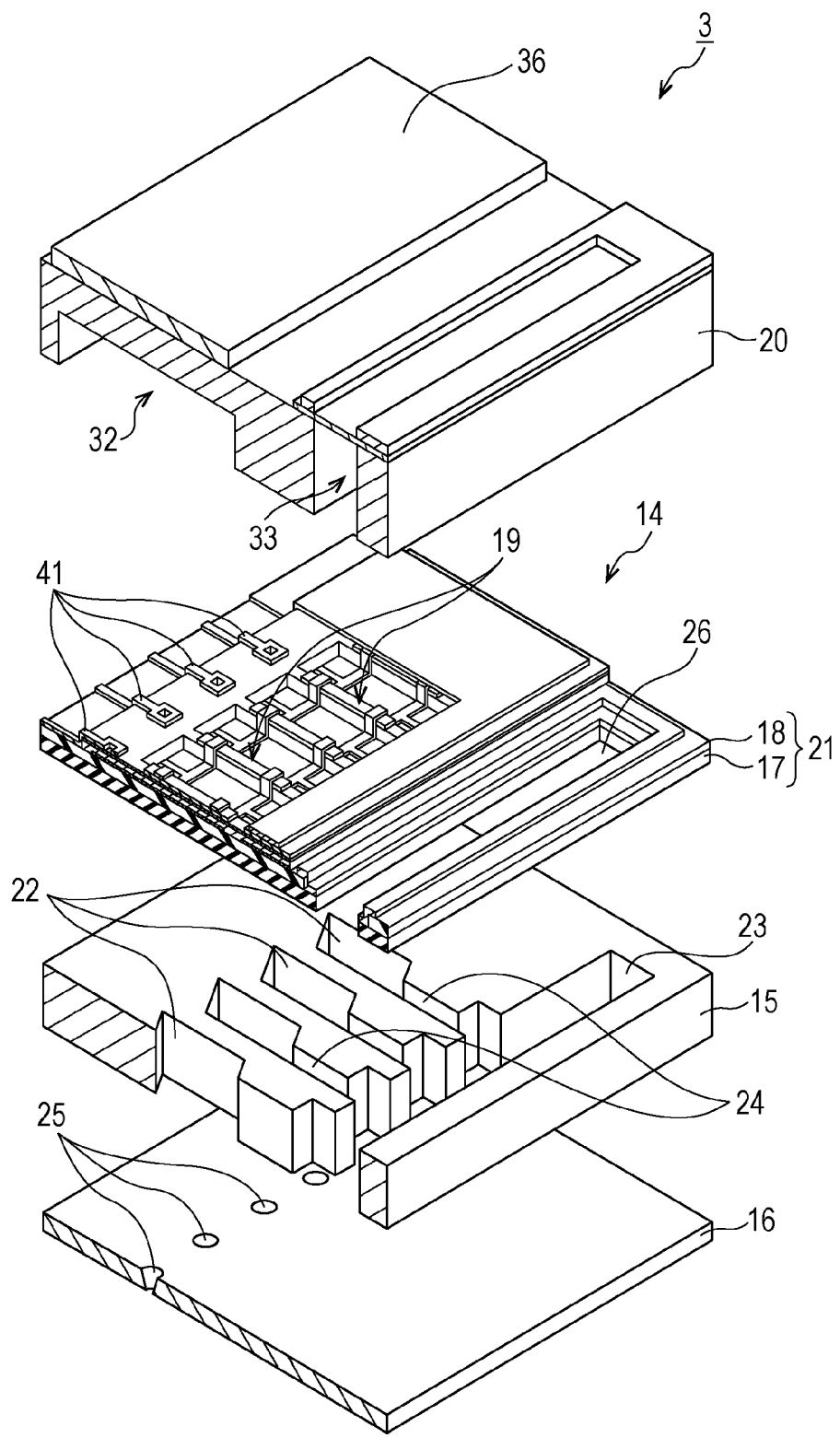
FIG. 2 is an exploded perspective view for explaining a configuration of a recording head.
Figure 3:
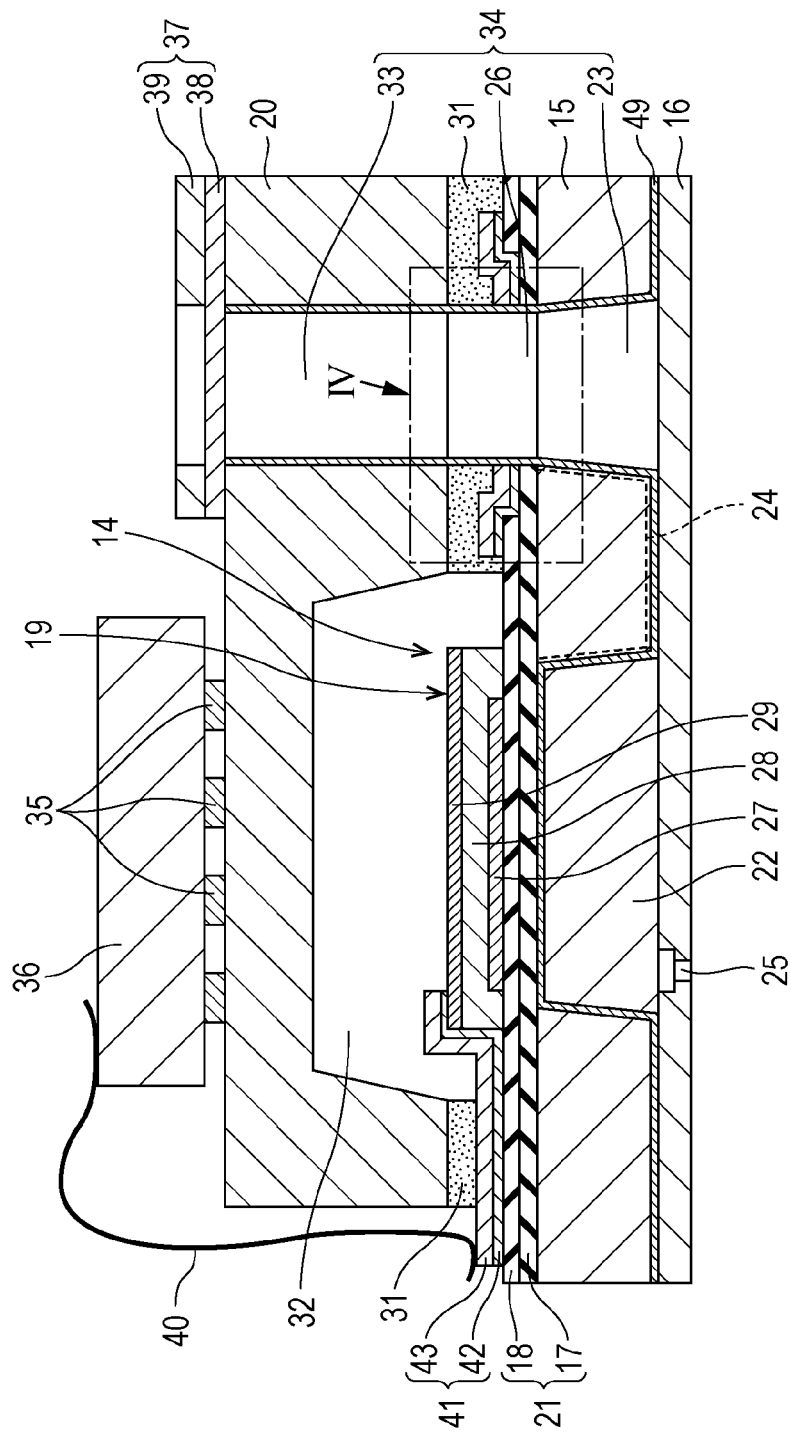
FIG. 3 is a cross-sectional view illustrating a configuration of the recording head.

FIG. 2 is an exploded perspective view illustrating the configuration of the recording head 3 of this embodiment. In addition, FIG. 3 is a cross-sectional view illustrating the configuration of the recording head 3. Further, in the following description, the stacking direction of the constituent members of the recording head 3 is appropriately described as the vertical direction or the height direction.

The recording head 3 in this embodiment is a type of MEMS device formed by stacking a pressure-chamber-forming substrate 15 (corresponding to a first member of the invention), a nozzle plate 16, an actuator unit 14, a sealing plate 20 (corresponding to a second member of the invention), and the like on top of one another. The pressure-chamber-forming substrate 15 is formed of a silicon substrate (for example, a single-crystal silicon substrate) and a plurality of spaces to become pressure chambers 22 (also simply referred to as the pressure chambers 22) are formed along a nozzle row direction. Each of the pressure chambers 22 is elongated in a direction perpendicular to the nozzle row direction and communicates with a corresponding one of nozzles 25 at an end portion on the opposite side to a supply space 23. In addition, each of the pressure chambers 22 is formed at the same pitch as the formation pitch of the nozzles 25 along the nozzle row direction. The supply space 23 (corresponding to a first space of the invention) that penetrates the pressure-chamber-forming substrate 15 is formed in a region outside the region where the pressure chambers 22 of the pressure-chamber-forming substrate 15 are formed. The supply space 23 is a space for supplying ink to the plurality of pressure chambers 22, and as illustrated in FIG. 2, the supply space 23 is elongated along the nozzle row direction. The supply space 23 and each of the pressure chambers 22 are connected to each other via a supply path 24 having a narrower width than the pressure chamber 22. Further, the supply space 23 communicates with a vibration plate opening 26 of a vibration plate 21 (to be described later) and a communication space 33 (corresponding to a second space of the invention) of the sealing plate 20 and the like, and forms a reservoir 34 (a common liquid chamber) which is a chamber that supplies ink common to the plurality of pressure chambers 22. The configuration of this communication portion will be described in detail later.

In addition, in the pressure-chamber-forming substrate 15, a protective layer 49 is formed on the inner surfaces of the pressure chambers 22, supply paths 24 and the supply space 23, and the lower surface of the pressure-chamber-forming substrate 15. The protective layer 49 is formed of a material having resistance (ink resistance) to a liquid, a gas or the like (solvent ink in this embodiment) flowing from the supply space 23 to the pressure chambers 22. For example, in the case where the liquid flowing in the supply space 23 or the like is a solvent ink as in this embodiment, tantalum oxide (TaOx), which is resistant to the solvent ink, is suitably used as the protective layer 49. Further, as the protective layer 49, any material may be used as long as it is more resistant to the liquid or gas flowing through the supply space 23 or the like than the pressure-chamber-forming substrate 15. In addition, a configuration in which no protective layer is formed on the lower surface of the pressure-chamber-forming substrate 15 may be adopted.

The nozzle plate 16 is fixed to the lower surface of the pressure-chamber-forming substrate 15 (the surface on the opposite side to the actuator unit 14). The nozzle plate 16 is formed of a silicon substrate (for example, a single-crystal silicon substrate), and a plurality of the nozzles 25 that communicate with the pressure chambers 22 are formed in corresponding ones of the pressure chambers 22. That is, in the nozzle plate 16, a plurality of the nozzles 25 are formed linearly (in other words, in a row) along the longitudinal direction of the nozzle plate 16. The plurality of the arranged nozzles 25 (that is, a nozzle row) are provided at equal intervals at a pitch corresponding to the dot formation density from one end of the nozzles 25 to the other end of the nozzles 25.

The actuator unit 14 includes the vibration plate 21, a piezoelectric element 19, and the like, and is stacked on the pressure-chamber-forming substrate 15. The vibration plate 21 is formed of an elastic film 17 formed of, for example, silicon dioxide ($SiO_2$) formed on the upper surface of the pressure-chamber-forming substrate 15 and an insulating film 18 formed of zirconium dioxide ($ZrO_2$) formed on the elastic film 17. Portions of the vibration plate 21 corresponding to the pressure chambers 22, that is, portions closing the upper openings of the pressure chambers 22 function as displacement portions which are displaced in a direction away from or in a direction toward the nozzles 25 in accordance with flexure of piezoelectric elements 19. In addition, the vibration plate opening 26 that communicates with the supply space 23 is formed in a portion of the vibration plate 21 corresponding to the supply space 23 of the pressure-chamber-forming substrate 15.

As illustrated in FIG. 3, each of the piezoelectric elements 19 is formed on the upper surface of a portion of the vibration plate 21 (specifically, the insulating film 18) corresponding to a corresponding one of the pressure chambers 22. The piezoelectric elements 19 of this embodiment are so-called bend mode piezoelectric elements. In each of the piezoelectric elements 19, a lower electrode layer 27, a piezoelectric layer 28, and an upper electrode layer 29 are stacked in this order on the vibration plate 21. The lower electrode layer 27 is a common electrode that is provided continuously over the plurality of the pressure chambers 22, and the upper electrode layer 29 is an individual electrode that is provided independently for each of the pressure chambers 22. Further, the upper electrode layer 29 may be a common electrode and the lower electrode layer may be an individual electrode depending on the drive circuit and wiring. Each of the piezoelectric elements 19 formed in this way, when subjected to an electric field corresponding to the electrode potential difference between the lower electrode layer 27 and the upper electrode layer 29, bends in a direction away from or in a direction toward a corresponding one of the nozzles 25. As a result, the volume of the pressure chamber 22 changes, causing pressure fluctuation in the ink in the pressure chamber 22. By utilizing this pressure fluctuation, the recording head 3 ejects ink from the nozzle 25.

In addition, a lead electrode portion 41 extending from the piezoelectric element 19 is formed on the vibration plate 21 in a region outside the region corresponding to the pressure chamber 22 (specifically, on the outer side on the opposite side to the vibration plate opening 26). The lead electrode portion 41 is formed of a contact layer 42 formed on the vibration plate 21 and a metal layer 43 formed on the contact layer 42. As the metal layer 43, for example, gold (Au), platinum (Pt), aluminum (Al), copper (Cu), a mixture thereof, or the like can be used. As the contact layer 42, for example, nickel (Ni), chromium (Cr), titanium (Ti), an alloy such as titanium tungsten (TiW), nickel chromium (NiCr), or the like can be used. In particular, if a material that does not easily corrode, such as nickel chromium (NiCr), is used as the contact layer 42, the reliability of the recording head 3 can be improved. Further, if the adhesion force between the vibration plate 21 and the metal layer 43 is sufficient, the contact layer 42 between the vibration plate 21 and the metal layer 43 can be omitted. Furthermore, the contact layer 42 and the metal layer 43 are also formed on the vibration plate 21 at the periphery of the vibration plate opening 26. The configuration of the contact layer 42 and the metal layer 43 at the periphery of the vibration plate opening 26 will be described in detail later.

The sealing plate 20 is joined to the upper surface of the actuator unit 14 via an adhesive layer 31 formed of an adhesive. The sealing plate 20 is formed with a housing space 32 capable of housing the piezoelectric element 19 and the communication space 33 that communicates with the supply space 23 and that becomes the reservoir 34. The housing space 32 is formed so as to be recessed from the lower-surface side of the sealing plate 20 to the middle of the upper-surface side. On the other hand, the communication space 33 is formed so as to penetrate the sealing plate 20 in the thickness direction. The communication space 33 is formed so as to be elongated along the direction in which the pressure chambers 22 are arranged and defines the reservoir 34 that communicates in series with the supply space 23 or the like and supplies ink to the pressure chambers 22 as described above. In addition, the protective layer 49 is formed from the surface defining the communication space 33 of the sealing plate 20 to the surface defining the supply space 23 of the pressure-chamber-forming substrate 15 among the surfaces defining the reservoir 34. Further, the adhesive layer 31 in this embodiment is disposed on the lower surface of the sealing plate 20 at the outer periphery of the opening edge of the housing space 32 and at the outer periphery of the opening edge of the communication space 33.

In addition, a driver IC 36 for driving each of the piezoelectric elements 19 and a compliance substrate 37 are joined to the upper surface of the sealing plate 20. The driver IC 36 is mounted on the upper surface of the sealing plate 20 such that its terminal portions (not illustrated) are connected to connection terminals 35 formed on the upper surface of the sealing plate 20. In addition, the other end portion of connection wiring 40 is electrically connected to the driver IC 36. Consequently, a drive signal from the driver IC 36 is supplied to the piezoelectric element 19 via the connection wiring 40 and the lead electrode portion 41. The compliance substrate 37 is a substrate that seals the upper surface of the communication space 33 so as to partition the reservoir 34, and is formed by stacking a sealing film 38 that is flexible and a fixing substrate 39 formed of a hard member such as a metal on each other. The compliance substrate 37 in this embodiment is joined to the upper surface of the sealing plate 20 in a state where the sealing film 38 is disposed below (that is, on the sealing plate 20 side). In a region of the compliance substrate 37 facing the communication space 33 other than the periphery of an inlet hole (not illustrated) for introducing the ink into the communication space 33, the fixing substrate 39 is removed and only the sealing film 38 remains. The portion consisting solely of the sealing film 38 functions as a compliance portion that absorbs pressure fluctuation of the ink inside the communication space 33, that is, the reservoir 34.

Figure 4:
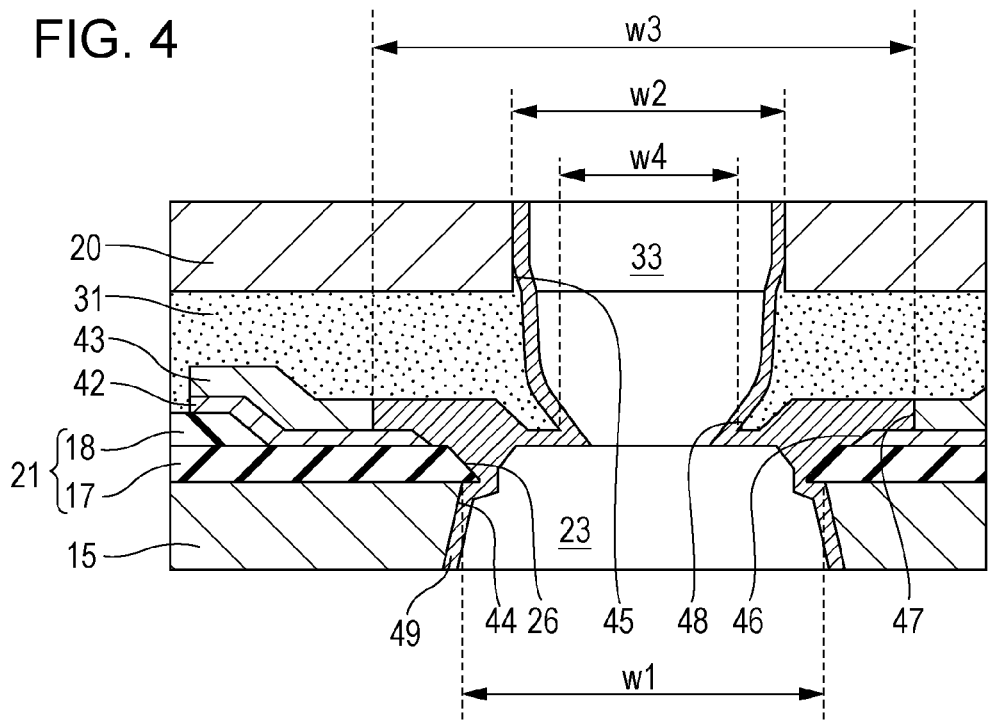
FIG. 4 is an enlarged view of a region IV in FIG. 3.

Next, the configuration of a communication portion between the supply space 23 and the communication space 33 in the reservoir 34 will be described in detail. FIG. 4 is an enlarged view of a region IV in FIG. 3. On the outer peripheral edge of the opening of the supply space 23 (corresponding to a first opening of the invention, hereinafter referred to as substrate opening 44) on the upper surface of the pressure-chamber-forming substrate 15, the vibration plate 21 (more specifically, the elastic film 17), the contact layer 42, and the metal layer 43 are stacked in this order. In addition, the adhesive layer 31 is formed on the outer peripheral edge of the substrate opening 44. That is, the adhesive layer 31 is formed between the outer peripheral edge of the substrate opening 44 of the pressure-chamber-forming substrate 15 and the outer peripheral edge of the opening of the communication space 33 on the lower surface of the sealing plate 20 (corresponding to a second opening of the invention and hereinafter referred to as sealing plate opening 45). Openings are formed in the vibration plate 21, the contact layer 42, the metal layer 43, and the adhesive layer 31, respectively, to allow the supply space 23 and the communication space 33 to communicate with each other. Specifically, the vibration plate opening 26 described above is formed in the vibration plate 21, and a contact layer opening 46 is formed in the contact layer 42. In addition, a metal layer opening 47 (corresponding to a third opening of the invention) is formed in the metal layer 43, and an adhesive layer opening 48 (corresponding to a fourth opening of the invention) is formed in the adhesive layer 31.

Here, as illustrated in FIG. 4, the opening width of the vibration plate opening 26 in the direction perpendicular to the nozzle row direction is smaller than an opening width w1 of the substrate opening 44 in the same direction. Similarly, the opening width of the vibration plate opening 26 in the nozzle row direction is smaller than the opening width of the substrate opening 44 in the same direction. In addition, the opening width of the contact layer opening 46 in the direction perpendicular to the nozzle row direction is larger than the opening width w1 of the substrate opening 44 in the same direction and is larger than an opening width w2 of the sealing plate opening 45 in the same direction. Similarly, the opening width of the contact layer opening 46 in the nozzle row direction is larger than the opening width of the substrate opening 44 in the same direction and larger than the opening width of the sealing plate opening 45 in the same direction. Furthermore, an opening width w3 of the metal layer opening 47 in the direction perpendicular to the nozzle row direction is larger than the opening width of the contact layer opening 46 in the same direction. Similarly, the opening width of the metal layer opening 47 in the nozzle row direction is larger than the opening width of the contact layer opening 46 in the same direction. That is, the opening width w3 of the metal layer opening 47 in the direction perpendicular to the nozzle row direction is larger than the opening width w1 of the substrate opening 44 in the same direction and larger than the opening width w2 of the sealing plate opening 45 in the same direction. In addition, the opening width of the metal layer opening 47 in the nozzle row direction is larger than the opening width of the substrate opening 44 in the same direction and larger than the opening width of the sealing plate opening 45 in the same direction. A minimum opening width w4 of the adhesive layer opening 48 in the direction perpendicular to the nozzle row direction is smaller than the opening width w1 of the substrate opening 44 in the same direction and smaller than the opening width w2 of the sealing plate opening 45 in the same direction. In addition, the minimum opening width of the adhesive layer opening 48 in the nozzle row direction is also smaller than the opening width of the substrate opening 44 in the same direction and smaller than the opening width of the sealing plate opening 45 in the same direction. Further, the adhesive layer opening 48 is formed so that its opening width gradually narrows downward. The minimum opening width of the adhesive layer opening 48 here is the opening width of the portion of the adhesive layer 31 which has the smallest opening width on the lower end side.

The inner surfaces of the substrate opening 44, the vibration plate opening 26, the contact layer opening 46, the metal layer opening 47, the adhesive layer opening 48, and the sealing plate opening 45 are covered with the protective layer 49. Specifically, as described above, the protective layer 49 is formed from the inner surface of the supply space 23 to the inner surface of the communication space 33, and is formed on the inner surface of the opening of each layer. Here, the width of the opening of each layer in the communication portion between the supply space 23 and the communication space 33 is as described above, and the opening width of the metal layer opening 47 is larger than the opening width of the adhesive layer opening 48, the opening width of the contact layer opening 46, and the opening width of the vibration plate opening 26. That is, the metal layer 43 is formed farther toward the outside (in other words, away from the reservoir 34) than the adhesive layer 31 and the vibration plate 21 (more specifically, the elastic film 17). Therefore, in an inner portion where the metal layer 43 does not exist (in other words, close to the reservoir 34), gaps are formed between the adhesive layer 31 and the adhesive layer 31 and between the adhesive layer 31 and the elastic film 17, however; in this embodiment, the protective layer 49 is also formed in these gaps. Consequently, it is possible to eliminate the exposed portion of the adhesive layer 31 and to cover the interface of the adhesive layer 31 and the metal layer 43 with the protective layer 49. Consequently, it is possible to suppress a problem that the adhesive layer 31 is eroded by the ink in the reservoir 34 and the adhesive strength is consequently lowered. In addition, because it is possible to protect the interfaces of the adhesive layer 31, particularly the interface with the metal layer 43 that has a relatively weak adhesion force, it is possible to suppress entry of ink from the interfaces and breakage of the piezoelectric element 19 and the like in the housing space 32. Furthermore, because the pressure chamber 22, the supply path 24, the supply space 23, and the communication space 33 are also protected by the protective layer 49, it is possible to suppress erosion of the inner surfaces thereof by the ink. As a result, the reliability of the recording head 3 is improved.

In addition, because the metal layer opening 47 is formed to be larger than the other openings, the interface between the metal layer 43 and the adhesive layer 31 can be retracted away from the communication space between the supply space 23 and the communication space 33. Consequently, it is possible to further suppress the ink from entering the interface of the metal layer 43 and the adhesive layer 31 and to further suppress a decrease in the adhesive strength of the adhesive layer 31. Furthermore, because the adhesive layer opening 48 is formed to be smaller than the other openings, the amount of the adhesive forming the adhesive layer 31 can be increased. Consequently, the adhesive strength between the pressure-chamber-forming substrate 15 and the sealing plate 20 can be increased. In addition, by narrowing the adhesive layer opening 48, it is possible to reduce the flow passage area (in other words, the cross-sectional area) in the communication portion between the supply space 23 and the communication space 33. Consequently, it is possible to increase the flow velocity of the ink in the communication portion, and for example, it is easy to discharge dust, bubbles or the like to the nozzle 25 side. In this embodiment, because the contact layer 42 is formed between the metal layer 43 and the pressure-chamber-forming substrate 15, the adhesion of the metal layer 43 to the pressure-chamber-forming substrate 15 can be improved.

Figure 11:
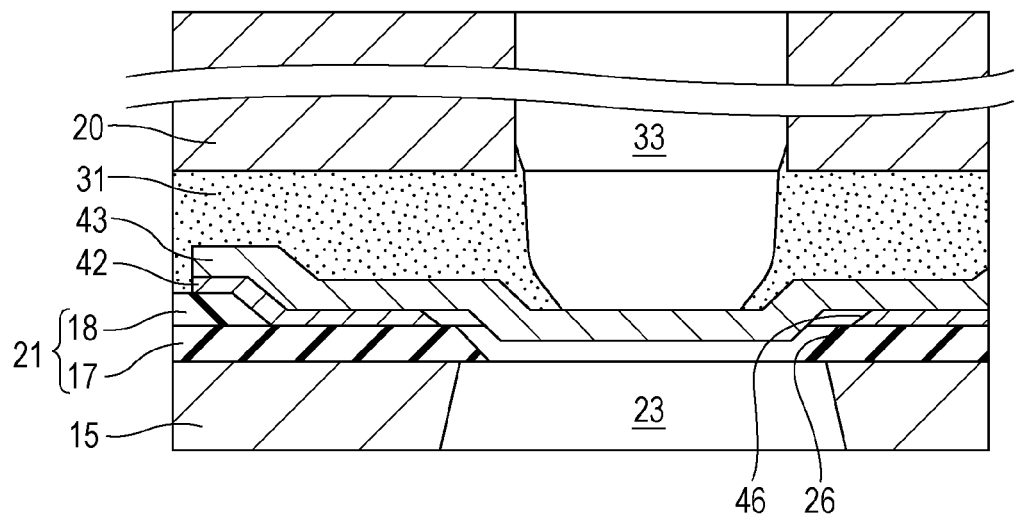
FIG. 11 is a state transition diagram of a cross section of a main portion for explaining the method of manufacturing the recording head.
Figure 12:
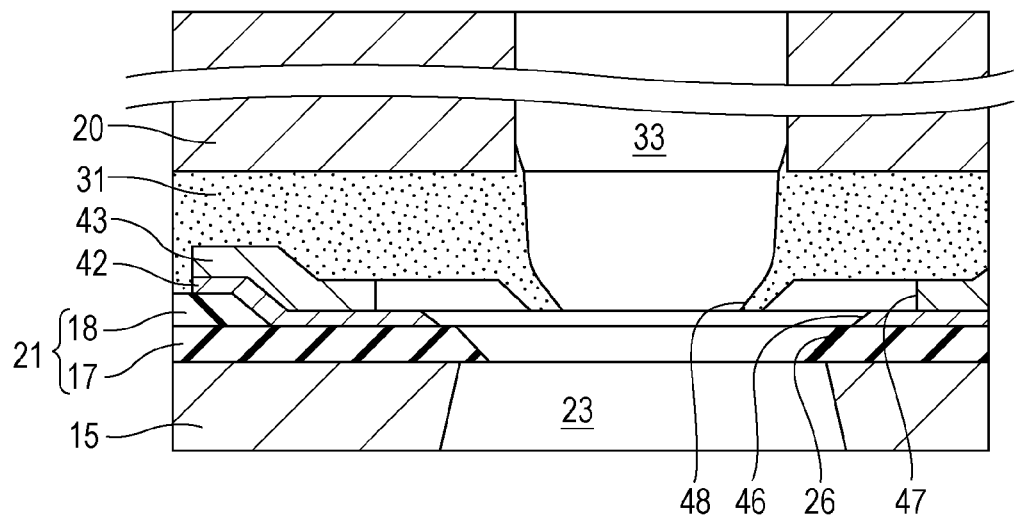
FIG. 12 is a state transition diagram of a cross section of the main portion for explaining the method of manufacturing the recording head.
Figure 13:
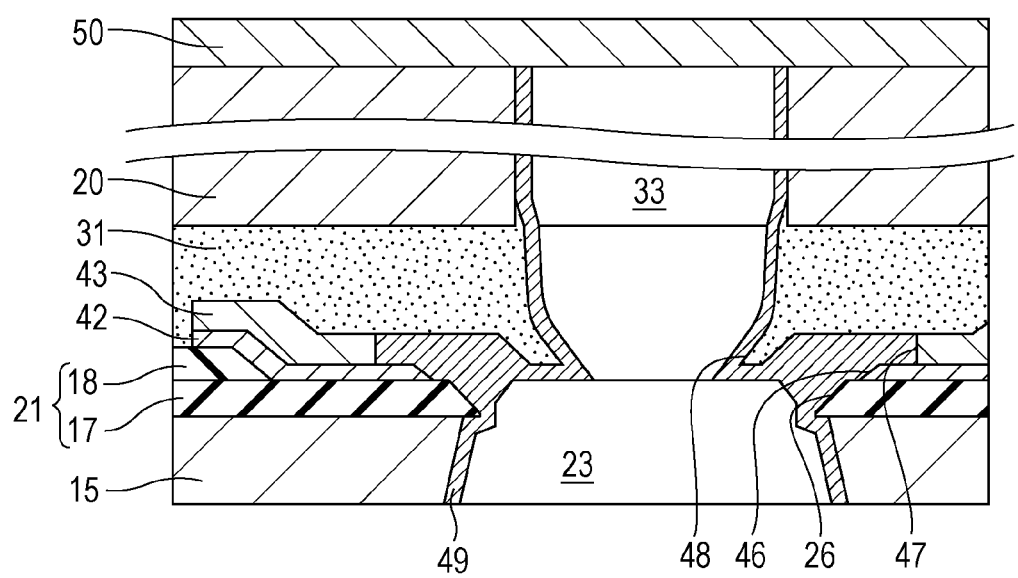
FIG. 13 is a state transition diagram of a cross section of the main portion for explaining the method of manufacturing the recording head.

Next, a method of manufacturing the recording head 3 will be described. FIG. 5 to FIG. 9 are state transition diagrams of a cross section for explaining a method of manufacturing the recording head 3. FIG. 11 to FIG. 13 are state transition diagrams of a cross section of the communication portion between the supply space 23 and the communication space 33.

Figure 5:
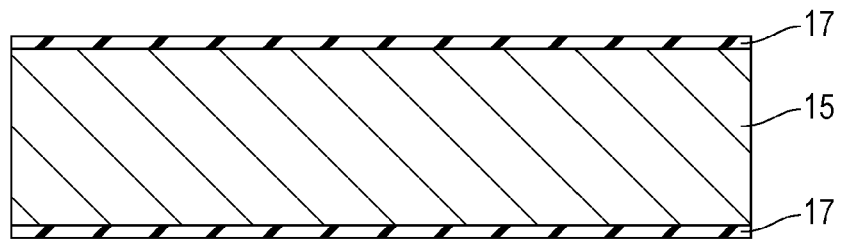
FIG. 5 is a state transition diagram of a cross section for explaining a method of manufacturing the recording head.
Figure 6:
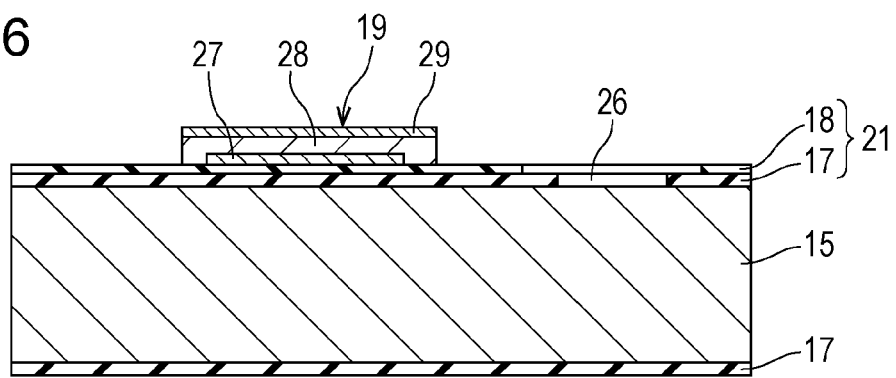
FIG. 6 is a state transition diagram of a cross section for explaining the method of manufacturing the recording head.
Figure 7:
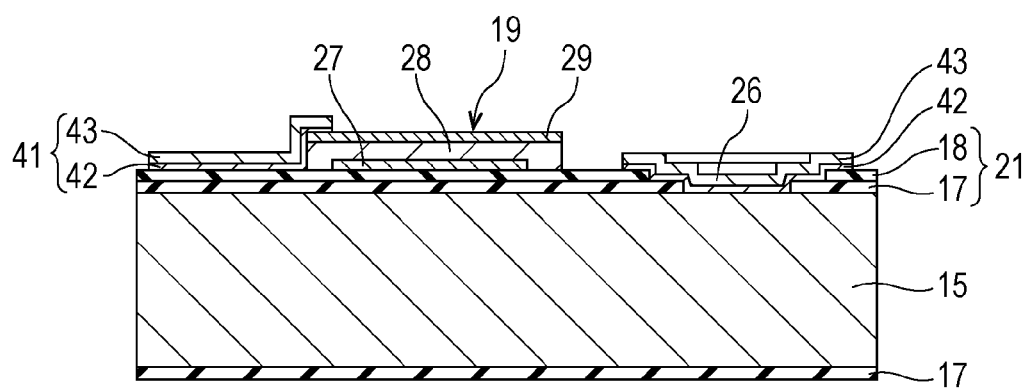
FIG. 7 is a state transition diagram of a cross section for explaining the method of manufacturing the recording head.

First, as illustrated in FIG. 5, the elastic film 17 is formed by thermal oxidation or the like on a surface (in this embodiment, both the upper surface and lower surface) of a substrate such as a silicon wafer to be the pressure-chamber-forming substrate 15 (hereinafter simply referred to as the pressure-chamber-forming substrate 15). Next, as illustrated in FIG. 6, the insulating film 18 is formed on the elastic film 17. For example, after forming a layer of zirconium (Zr) by sputtering or the like, the insulating film 18 is formed by thermally oxidizing the zirconium layer. Consequently, the vibration plate 21 is formed on the upper surface of the pressure-chamber-forming substrate 15. After the vibration plate 21 is formed, an electrode layer to be the lower electrode layer 27 is formed and then etched and patterned into a predetermined shape. Similarly, for example, a piezoelectric layer made of lead zirconate titanate (PZT) or the like and an electrode layer to be the upper electrode layer 29 are formed and then etched and patterned into a predetermined shape. Consequently, as illustrated in FIG. 6, the piezoelectric element 19 that is formed of the lower electrode layer 27, the piezoelectric layer 28, and the upper electrode layer 29 is formed at a predetermined position. In addition, after forming the piezoelectric element 19, the insulating film 18 is etched, and then the elastic film 17 is etched to form the vibration plate opening 26. Further, in this embodiment, as illustrated in FIG. 6, the opening of the insulating film 18 is formed so that the opening area is larger than the opening of the elastic film 17. After forming the vibration plate opening 26, as illustrated in FIG. 7, the contact layer 42 and the metal layer 43 are formed. To be specific, a layer to be the contact layer 42 and a layer to be the metal layer 43 are formed in this order and etched and patterned into a predetermined shape. Consequently, as illustrated in FIG. 7, the lead electrode portion 41 that is formed of the contact layer 42 and the metal layer 43 is formed and the contact layer 42 and the metal layer 43 are formed so as to cover the vibration plate opening 26.

Figure 8:
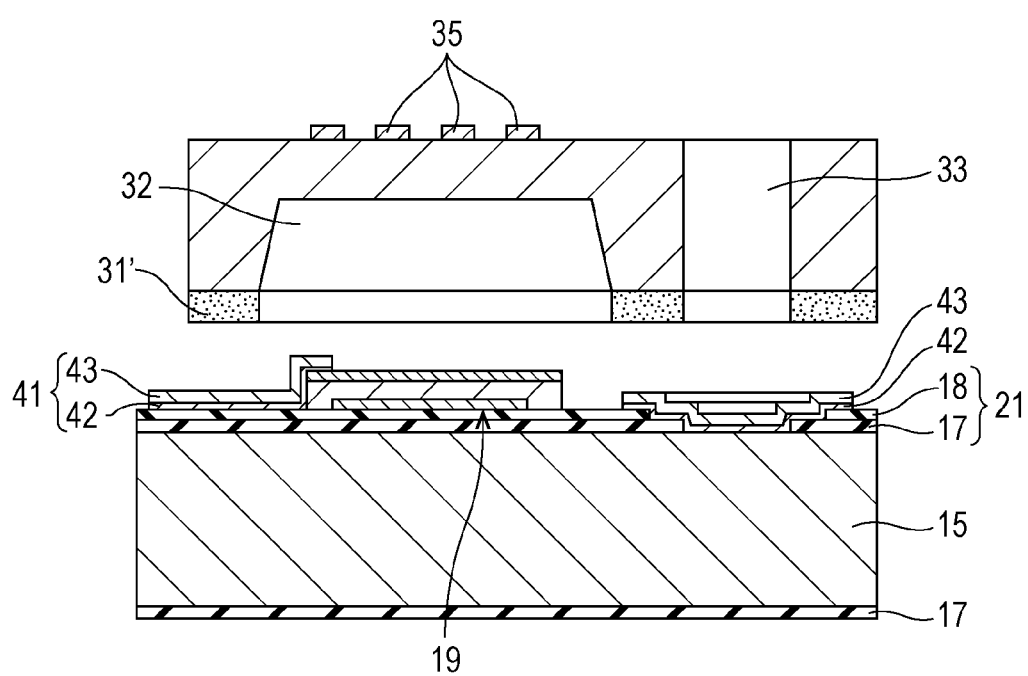
FIG. 8 is a state transition diagram of a cross section for explaining the method of manufacturing the recording head.
Figure 9:
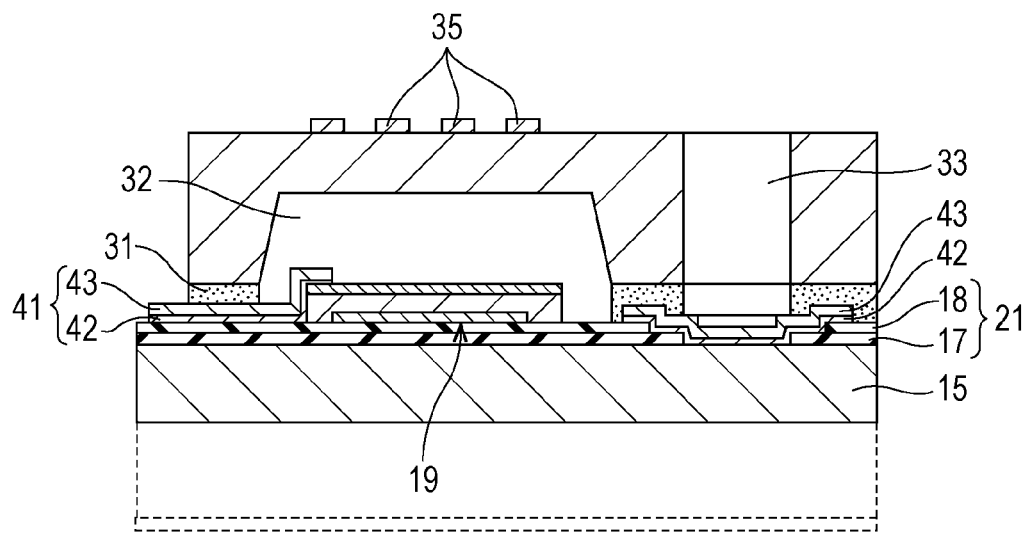
FIG. 9 is a state transition diagram of a cross section for explaining the method of manufacturing the recording head.
Figure 10:
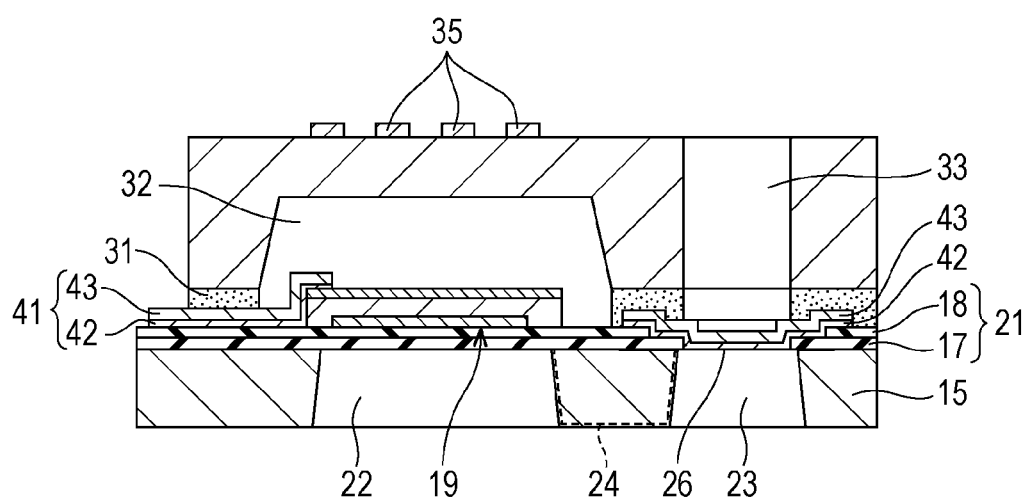
FIG. 10 is a state transition diagram of a cross section for explaining the method of manufacturing the recording head.

Next, as illustrated in FIG. 8, a substrate such as a silicon wafer to be the sealing plate 20 (hereinafter simply referred to as the sealing plate 20) is joined to the pressure-chamber-forming substrate 15. Further, the housing space 32, the communication space 33, the connection terminals 35, and the like are formed in the sealing plate 20 beforehand. When adhering the sealing plate 20 to the pressure-chamber-forming substrate 15, firstly, an adhesive 31' is applied to the lower surface of the sealing plate 20 (the surface on the side of the pressure-chamber-forming substrate 15) by film transfer. In this state, either one of the sealing plate 20 and the pressure-chamber-forming substrate 15 is relatively moved toward the other, and, while sandwiching the adhesive 31' therebetween, the adhesive 31' is solidified. Consequently, as illustrated in FIG. 9, the adhesive layer 31 in which the adhesive has solidified is formed between the sealing plate 20 and the pressure-chamber-forming substrate 15, and the sealing plate 20 and the pressure-chamber-forming substrate 15 are joined to each other. Further, the adhesive can also be applied to the pressure-chamber-forming substrate 15. After joining the sealing plate 20 and the pressure-chamber-forming substrate 15, as illustrated in FIG. 9, the pressure-chamber-forming substrate 15 is polished to a predetermined thickness. Further, the broken line illustrated in FIG. 9 represents the outer shape of the pressure-chamber-forming substrate 15 before being polished. Thereafter, as illustrated in FIG. 10, the pressure chamber 22, the supply path 24, the supply space 23, and the like are formed by anisotropic etching (wet etching) of the pressure-chamber-forming substrate 15. At this time, because the vibration plate opening 26 is covered with the contact layer 42 and the metal layer 43, it is possible to prevent the etchant from flowing into the sealing plate 20 via the vibration plate opening 26. Consequently, it is possible to suppress problems such as etching of the inner surface of the communication space 33 and disconnection of the connection terminal 35 and other wiring and the like.

Next, the supply space 23 and the communication space 33 are made to communicate with each other by removing the contact layer 42 and the metal layer 43. To be more specific, first, as illustrated in FIG. 11, the contact layer 42 in the communication portion between the supply space 23 and the communication space 33 is removed by wet etching. That is, the contact layer 42 exposed in the vibration plate opening 26 is exposed to the etching liquid to form the contact layer opening 46. At this time, the contact layer 42 is removed on the outside of the edge of the substrate opening 44 that is formed in the upper surface side of the supply space 23 (specifically, outside of the communication portion between the supply space 23 and the communication space 33). Consequently, the contact layer opening 46 having a larger opening width than the substrate opening 44 is formed. Thereafter, as illustrated in FIG. 12, the metal layer 43 in the communication portion between the supply space 23 and the communication space 33 is removed by wet etching. That is, the metal layer 43 is exposed to the etching liquid while leaving the metal layer 43 in the boundary between the supply space 23 and the communication space 33 (in other words, in the space between the supply space 23 and the communication space 33) and the contact layer opening 46 is formed. At this time, at least a portion of the metal layer 43 is left in a region overlapping with the adhesive layer 31 in the height direction, and the metal layer 43 is positioned outside the edge of the contact layer opening 46 (specifically, outside the communication portion between the supply space 23 and the communication space 33). Consequently, the metal layer opening 47 having a larger opening width than the contact layer opening 46 is formed, and the supply space 23 and the communication space 33 communicate with each other through the metal layer opening 47. Further, the removal of this metal layer 43 corresponds to forming of the opening in the metal layer in the invention.

Once the contact layer 42 and the metal layer 43 are removed and the supply space 23 and the communication space 33 are made to communicate with each other, the protective layer 49 is formed. To be more specific, as illustrated in FIG. 13, the protective layer 49 is formed from the inner surface of the supply space 23 to the inner surface of the communication space 33 by an atomic layer deposition method (ALD method) while the opening on the upper side of the communication space 33 (the side opposite to the supply space 23) is closed with a closing member 50 such as a protective film or a protective tray. Consequently, as described above, the inner surface of the vibration plate opening 26, the inner surface of the contact layer opening 46, the inner surface of the metal layer opening 47, and the inner surface of the adhesive layer opening 48, and the vibration plate 21, the contact layer 42, the metal layer 43 and the adhesive layer 31, and their respective interfaces are covered with the protective layer 49. Further, at this time, as illustrated in FIG. 3, the lower surface of each of the pressure chamber 22, the supply path 24, and the pressure-chamber-forming substrate 15 is also covered with the protective layer 49. In addition, the formation of the protective layer 49 corresponds to covering of the adhesive layer and the inner surface of the opening of the metal layer in the invention.

After forming the protective layer 49 in this manner, the closing member 50 is removed and the driver IC 36 is mounted on the upper surface of the sealing plate 20. In addition, the driver IC 36 that has been mounted and the lead electrode portion 41 are connected via the connection wiring 40. Furthermore, the nozzle plate 16 having nozzle openings formed therein is joined to the lower surface of the pressure-chamber-forming substrate 15. Then, the compliance substrate 37 is joined to the sealing plate 20. Finally, the recording head 3 as described above can be manufactured by dividing the pressure-chamber-forming substrate 15 or the like into individual chip sizes by dicing or the like.

In this way, because the protective layer 49 is formed from the inner surface of the supply space 23 to the inner surface of the communication space 33, the adhesive layer 31 and the interfaces of the adhesive layer 31 (particularly the interface of the adhesive layer 31 and the metal layer 43) can be protected by the protective layer 49. Consequently, it is possible to suppress the weakening of the adhesive force of the adhesive layer 31 due to ink or the like affecting the adhesive layer 31. As a result, problems such as peeling of the adhesive layer 31 and breakage of the piezoelectric element 19 and the like due to ink entering the housing space 32 from the interface of the adhesive layer 31 can be suppressed. In addition, because the protective layer 49 is formed in a state where the supply space 23 and the communication space 33 are in communication with each other, it is possible to reduce the number of operations as compared with a manufacturing method in which, after a protective layer is formed on either one of the substrate serving as the pressure-chamber-forming substrate and the substrate serving as the sealing plate, a protective layer is formed on the other substrate. Furthermore, because at least a portion of the metal layer 43 is left in a region overlapping with the adhesive layer 31, it is possible to increase the adhesive strength as compared with the case where the metal layer does not remain in the region overlapping with the adhesive layer. That is, if the metal layer does not remain, gaps are formed in the portion where the metal layer was present, and there is a possibility that the adhesive strength may be lowered. However, by keeping the metal layer 43 in a region overlapping with the adhesive layer 31, such a reduction in strength can be suppressed. In addition, by leaving the metal layer 43 in a region overlapping with the adhesive layer 31, it is possible to reduce the region where the adhesive layer 31 is likely to be exposed. Consequently, it is possible to suppress a decrease in the adhesive strength of the adhesive layer 31 caused by penetration of the ink. Furthermore, in this embodiment, as illustrated in FIG. 3, because a portion of the sealing plate 20 is joined so as to overlap with the lead electrode portion 41, the height from the surface of the pressure-chamber-forming substrate 15 in the region where the sealing plate 20 is adhered can be easily made uniform. As a result, for example, it is possible to suppress a problem such as the sealing plate 20 being tilted and adhering to the pressure-chamber-forming substrate 15.

In addition, in this embodiment, because the protective layer 49 is formed by an atomic layer deposition method, the protective layer 49 can be easily formed uniformly from the inner surface of the supply space 23 to the inner surface of the communication space 33. That is, as in this embodiment, even when irregularities are formed from the inner surface of the first space to the inner surface of the second space, the protective layer 49 having a uniform thickness can be easily formed. Furthermore, when the protective layer 49 is formed, because the opening on the upper side of the communication space 33 is covered with the closing member 50, it is possible to suppress deposition of the protective layer 49 on components (for example, the connection terminals 35) outside of the sealing plate 20. In addition, in the case where the protective layer 49 is formed by placing the wafer formed by joining the sealing plate 20 and the pressure-chamber-forming substrate 15 to each other in such a manner that the sealing plate 20 is on a stage, deposition of the protective layer 49 on the stage can also be suppressed.

Figure 14:
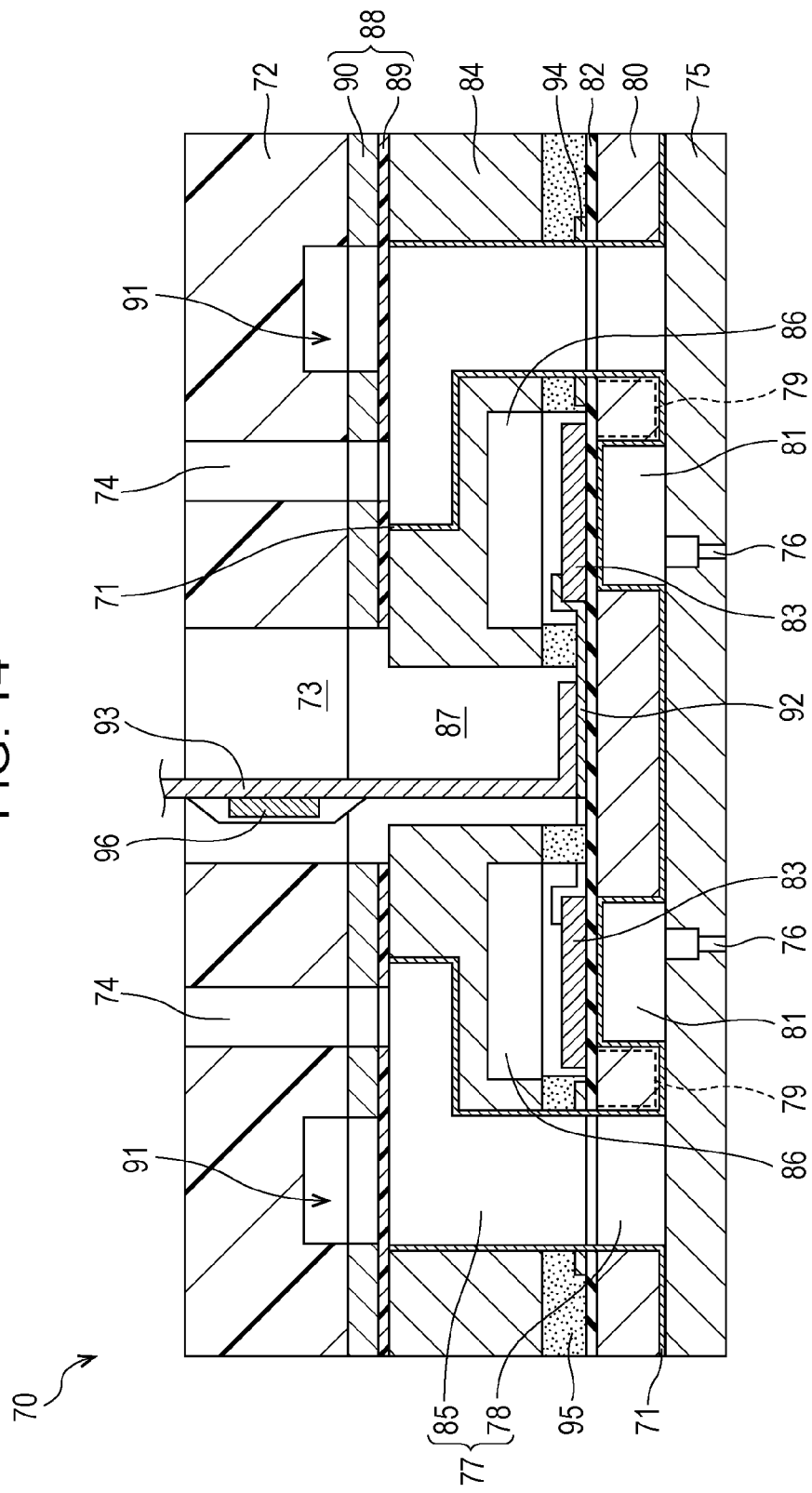
FIG. 14 is a cross-sectional view illustrating a configuration of a recording head according to a second embodiment.

Further, in the recording head 3 of the first embodiment described above, the driver IC 36 is mounted on the upper surface of the sealing plate 20, but the configuration is not limited thereto. For example, it is possible to adopt a configuration in which a wiring substrate having a driver IC is connected to a lead electrode portion. Specifically, this will be described in detail with reference to FIG. 14. FIG. 14 is a cross-sectional view of the main portion of a recording head 70 according to a second embodiment. The recording head 70 in this embodiment is attached to a head case 72 in a state where a nozzle plate 75, a pressure-chamber-forming substrate 80, piezoelectric elements 83, a sealing plate 84, a compliance substrate 88, and the like are stacked on one another.

The pressure-chamber-forming substrate 80 in this embodiment is also formed of a silicon substrate similarly to the first embodiment described above. Also in this embodiment, in the pressure-chamber-forming substrate 80, a plurality of pressure chambers 81 and communication spaces 85 (corresponding to the second space of the invention) parallelly arranged along the nozzle row direction are made to communicate and supply spaces 78 (corresponding to the first space of the invention) constituting reservoirs 77 and supply paths 79 that connect the pressure chambers 81 and the supply spaces 78 to each other are formed. As illustrated in FIG. 14, in this embodiment, the pressure chambers 81 are formed in two rows, and correspondingly, the supply spaces 78 are formed in two rows. Also in this embodiment, a protective layer 71 is formed on the inner surface of each of the pressure chambers 81, the supply paths 79 and the supply spaces 78 of the pressure-chamber-forming substrate 80, and the lower surface of the pressure-chamber-forming substrate 80.

The nozzle plate 75 is fixed to the lower surface (the surface opposite to the sealing plate 84) of the pressure-chamber-forming substrate 80. The nozzle plate 75 in this embodiment is also formed of a silicon substrate in the same manner as in the first embodiment described above, and a plurality of nozzles 76 that communicate with the pressure chambers 81 are respectively formed in corresponding ones of the pressure chambers 81. In this embodiment, rows of the nozzles 76 (nozzle rows) that are separated from each other are formed in two rows corresponding to rows of the pressure chambers 81 formed in two rows. A vibration plate 82 is stacked on the upper surface of the pressure-chamber-forming substrate 80 (surface opposite to the nozzle plate 75). This vibration plate 82 is also formed of an elastic film and an insulating film (none of them are illustrated) as in the first embodiment. In addition, openings are formed in the vibration plate 82 in the communication portions of the communication spaces 85 and the supply spaces 78.

The piezoelectric elements 83 are stacked on the upper surface of the vibration plate 82 in regions corresponding to respective ones of the pressure chambers 81. Each of the piezoelectric elements 83 in this embodiment is also a so-called deflection mode piezoelectric element. In addition, although not illustrated, the piezoelectric element 83 in this embodiment is formed by sequentially stacking a lower electrode layer to be an individual electrode, a piezoelectric layer, and an upper electrode layer to be a common electrode in order from the vibration plate 82. Further, the lower electrode layer may be a common electrode and the upper electrode layer may be an individual electrode depending on the drive circuit and wiring. In addition, a lead electrode portion 92 that extends from the piezoelectric element 83 is formed from a region corresponding to the pressure chamber 81 on the vibration plate 82 to a region between piezoelectric element rows formed in two rows. The lead electrode portion 92 is formed of a contact layer (not illustrated) formed on the vibration plate 82 and a metal layer 94 formed on the contact layer. Also in this embodiment, as in the first embodiment, the contact layer and the metal layer 94 are formed on the vibration plate 82 on the periphery of the openings of the communication portions of the communication spaces 85 and the supply spaces 78.

The sealing plate 84 is joined to the upper surface of the vibration plate 82 via an adhesive layer 95. In the sealing plate 84, the communication spaces 85 serving as the reservoirs 77, housing spaces 86 isolated from the communication spaces 85, and the like are formed. While each of the communication spaces 85 in this embodiment is formed in a state penetrating in the thickness direction at a position corresponding to a corresponding one of the supply spaces 78 and on the inner side from the supply space 78 (that is, on the center side in a direction perpendicular to the nozzle row direction), the sealing plate 84 is not penetrated in the plate thickness direction and is formed in a state of being recessed from the upper surface of the sealing plate 84 to the middle in the plate thickness direction. That is, the width (in other words, the dimension in a direction perpendicular to the nozzle row direction) of the upper portion of the communication space 85 (in other words, the portion on the head case 72 side) is larger than the width of the lower portion of the communication space 85 (in other words, the portion on the pressure-chamber-forming substrate 80 side). Also in this embodiment, the protective layer 71 is formed, among the surfaces defining each of the reservoirs 77, from the surface defining the communication space 85 of the sealing plate 84 to the surface defining the supply space 78 of the pressure-chamber-forming substrate 80. Further, because the configuration of the protective layer 71, the vibration plate 82, the adhesive layer 95, and the like in the communication portion between the communication space 85 and the supply space 78 is the same as that of the communication portion between the supply space 23 and the communication space 33 in the first embodiment illustrated in FIG. 4, explanation thereof is omitted. In addition, between the two housing spaces 86, a connecting space 87 in which the sealing plate 84 is removed in the thickness direction is formed. The connecting space 87 communicates with an insertion space 73 to be described later, and an end portion of a wiring member 93 such as a flexible printed circuit (FPC), for example, inserted through the insertion space 73 is disposed inside the connecting space 87. An end portion of the wiring member 93 is connected to the lead electrode portion 92 extending from each of the piezoelectric elements 83 in the connecting space 87. Further, in this embodiment, no driver IC is mounted on the upper surface of the sealing plate 84, and a driver IC 96 is provided on the wiring member 93.

The compliance substrate 88 is joined to the upper surface of the sealing plate 84. The compliance substrate 88 is a substrate that seals the upper surface of the supply spaces 78 and partitions the reservoirs 77; in this embodiment as well, as in the first embodiment, the compliance substrate 88 is formed of a sealing film 89 and a fixing substrate 90. In addition, a position corresponding to the insertion space 73 in the compliance substrate 88 and positions corresponding to liquid introduction paths 74 are openings penetrating in the thickness direction. Furthermore, in the regions of the compliance substrate 88 that face the reservoirs 77 other than the periphery of the liquid introduction paths 74, the fixing substrate 90 is removed and only the sealing film 89 remains. The portion including only the sealing film 89 functions as a compliance portion that absorbs the pressure fluctuation of the ink inside the reservoirs 77.

The head case 72 is joined to the upper surface of the compliance substrate 88. The head case 72 in this embodiment is a box-like member formed of a synthetic resin. The insertion space 73, which is an elongated space along the nozzle row direction, is formed in the central portion of the head case 72. The insertion space 73 is a space through which the wiring member 93 having the driver IC 96 is inserted, and is formed in a state penetrating the head case 72 in the thickness direction. In addition, the liquid introduction paths 74 connected to the reservoirs 77 are formed inside the head case 72. The lower ends of the liquid introduction paths 74 are connected to corresponding ones of the reservoirs 77 (more specifically, the communication spaces 85). Furthermore, compliance spaces 91 having a depth that does not hinder the flexible deformation of the sealing film 89 are formed in portions corresponding to the reservoirs 77 on the lower surface of the head case 72 in a state recessed from the lower surface. The compliance spaces 91 each open to a space outside the recording head 70 via an atmosphere release path (not illustrated) in which the flow resistance is increased as much as possible. Further, other configurations are substantially the same as those of the first embodiment described above, and thus the description thereof will be omitted. In addition, because the method for manufacturing the recording head in this embodiment is substantially the same as the method for manufacturing the recording head 3 in the first embodiment described above, and particularly the step of forming the communication portion between the communication space 85 and the supply space 78 is the same as the process of forming the communication portion between the communication space 33 and the supply space 23 in the first embodiment, description thereof is omitted.

The configuration of the communication portion between the communication space 85 and the supply space 78 in the recording head 70 of this embodiment has the same configuration as the communication portion between the communication space 33 and the supply space 23 in the recording head 3 of the first embodiment, and the method of manufacturing the recording head 70 according to this embodiment is substantially the same as the method of manufacturing the recording head 3 of the first embodiment, therefore, also in this embodiment, the same effects as those of the above-described first embodiment are exhibited.

In the above description, the recording head 3 and the recording head 70 that eject ink are described as examples of MEMS devices; however, the invention can also be applied to other liquid ejecting heads. For example, the invention can also be applied to a color material ejecting head used for manufacturing a color filter such as a liquid crystal display, an electrode material ejecting head used for forming electrodes of an organic electroluminescence (EL) display, a field emission display (FED), and the like, and a bioorganic material ejecting head used for manufacturing biochemical elements (biochips), and the like. In a color material ejecting head for a display manufacturing apparatus, a solution of each color material of Red (R), Green (G), and Blue (B) is ejected as a type of liquid. In addition, in the electrode material ejecting head for an electrode forming apparatus, a liquid electrode material is ejected as one type of liquid, and in the living organic matter ejecting head for a chip manufacturing apparatus, a solution of bioorganic matter is ejected as a type of liquid.

Furthermore, the invention is not limited to the liquid ejecting head and can be applied as long as it is a MEMS device in which a first member in which a first space is formed and a second member in which a second space communicating with the first space is formed are joined via an adhesive layer. For example, the invention can also be applied to a sensor for detecting pressure change, vibration, displacement or the like with a piezoelectric element. In addition, the invention can also be applied to a MEMS device such as a digital micromirror device (DMD).

What is claimed is:

1. A MEMS device in which a first member, on which a metal layer is stacked and in which a first space is formed, and a second member, in which a second space communicating with the first space is formed, are joined via an adhesive layer, comprising:
    a first opening formed in a communication portion of the first space that enables communication with the second space;
    a second opening formed in a communication portion of the second space that enables communication with the first space;
    a third opening formed in the metal layer in a communication portion between the first space and the second space to enable the first space and the second space to communicate with each other;
    a fourth opening formed in the adhesive layer in a communication portion between the first space and the second space to enable the first space and the second space to communicate with each other; and
    a protective layer covering an inner surface of each of the first opening, the second opening, the third opening, and the fourth opening,
    wherein an opening width of the third opening in one direction is wider than an opening width of the first opening in the one direction and an opening width of the second opening in the one direction, and an opening width of the fourth opening in the one direction is narrower than the opening width of the first opening in the one direction and the opening width of the second opening in the one direction,
    wherein the third opening is partially formed by a gap formed between the metal layer and the adhesive layer, and
    wherein an amount of the protective layer disposed in the gap is thicker than an amount of the protective layer not disposed in the gap.

2. The MEMS device according to claim 1, wherein a contact layer is formed between the metal layer and the first member.

3. The MEMS device according to claim 2, wherein the contact layer is formed of nickel (Ni), chromium (Cr), titanium (Ti), titanium tungsten (TiW), or nickel chromium (NiCr).

4. The MEMS device according to claim 1, wherein a pressure chamber is formed in the first member, wherein a housing space is formed in the second member, wherein a piezoelectric element is housed in the housing space, and wherein a vibration plate is provided between the pressure chamber and the piezoelectric element.

5. The MEMS device according to claim 1, wherein gold (Au) is used for the metal layer.

6. The MEMS device according to claim 5, wherein a layer of nickel chromium (NiCr) is formed between the metal layer and the first member.

7. The MEMS device according to claim 1, wherein tantalum oxide (TaOx) is used for the protective layer.

8. The MEMS device according to claim 1, wherein a nozzle plate having a nozzle formed thereon is joined to the first member so that the communication portions and the nozzle communicate with each other through the pressure chamber.

9. The MEMS device according to claim 8, wherein a liquid flows between the nozzle and the communication portions.

* * * * *